US007298152B1

(12) United States Patent
Wilke et al.

(10) Patent No.: US 7,298,152 B1
(45) Date of Patent: Nov. 20, 2007

(54) DAMAGE DETECTION SYSTEM

(75) Inventors: Daniel D. Wilke, Mesa, AZ (US); Dennis K. McCarthy, Higley, AZ (US)

(73) Assignee: The Boeing Company, Chicago, IL (US)

(*) Notice: Subject to any disclaimer, the term of this patent is extended or adjusted under 35 U.S.C. 154(b) by 62 days.

(21) Appl. No.: 11/437,237

(22) Filed: May 19, 2006

(51) Int. Cl.
*G01R 27/04* (2006.01)
*G01S 13/00* (2006.01)
*G01S 1/00* (2006.01)
*G01M 17/00* (2006.01)

(52) U.S. Cl. .................. 324/639; 342/58; 342/357.09; 701/29

(58) Field of Classification Search ................ 324/369, 324/639
See application file for complete search history.

(56) References Cited

U.S. PATENT DOCUMENTS 3,363,184 A 1/1968 Smith
4,573,521 A 3/1986 Artz et al.
4,627,034 A 12/1986 Herndon
4,972,176 A 11/1990 Vallance
5,426,362 A 6/1995 Ninnis
5,797,201 A * 8/1998 Huang ......................... 36/132
6,150,928 A * 11/2000 Murray .................. 340/426.14
6,263,737 B1 * 7/2001 Schoess ....................... 73/583
6,822,457 B2 * 11/2004 Borchert et al. ............ 324/512
6,915,861 B2 7/2005 Goodworth et al.
7,082,356 B2 * 7/2006 Mori ........................... 701/29
2003/0048203 A1 * 3/2003 Clary et al. ................. 340/945
2004/0117081 A1 * 6/2004 Mori ........................... 701/29
2006/0061369 A1 * 3/2006 Marks et al. ............... 324/542
2006/0073761 A1 * 4/2006 Weiss et al. ................ 446/456

OTHER PUBLICATIONS

Anonymous, *Sandia designs vibe-powered sensor that transforms shakes into electricity*, http://wwww.sandia.gov/media/NewsRel/NR2002/vibepoweredsensor.htm, article dated May 22, 2002, webpage printed Mar. 31, 2006.

* cited by examiner

*Primary Examiner*—Walter Benson
*Assistant Examiner*—Jeff Natalini
(74) *Attorney, Agent, or Firm*—Wildman Harrold Allen & Dixon, LLP

(57) ABSTRACT

A damage detection system includes a processor and a transmitter communicatively connected to the processor. The transmitter sends a signal to the processor and the processor is programmed to assign a spatial coordinate to the transmitter. The processor is further programmed to identify a transmitter location as damaged when the transmitter fails to send the signal. The damage detection system may analyze the damaged area and report potentially affected sub-systems to users of a machine or vehicle equipped with the damage detection system.

26 Claims, 4 Drawing Sheets

FIG. 4

100 — ID-to-Spatial Location Cress Reference File

| ID 1 (110) | System ID (112) | x (114) | y (116) | z (118) | Assigned Size (120) | Transmitting? (122) |
|---|---|---|---|---|---|---|
| 0001 | 1000 | 33.3 | -12.2 | 129.3 | 0.10 | YES |
| 0002 | 1000 | 33.4 | -12.2 | 129.3 | 0.10 | YES |
| 0003 | 1000 | 33.5 | -12.2 | 129.3 | 0.10 | YES |
| 0004 | 1000 | 33.6 | -12.2 | 129.3 | 0.10 | YES |
| 0005 | 1000 | 33.7 | -12.2 | 129.3 | 0.10 | YES |
| 0006 | 1000 | 33.8 | -12.2 | 129.3 | 0.10 | YES |
| xxxx | 1000 | 33.9 | -12.2 | 129.3 | 0.10 | NO |
| 0008 | 1000 | 34.0 | -12.2 | 129.3 | 0.10 | YES |
| 0009 | 1000 | 34.1 | -12.2 | 129.3 | 0.10 | YES |
| 0010 | 1000 | 34.2 | -12.2 | 129.3 | 0.10 | YES |
| 0011 | 1000 | 34.3 | -12.2 | 129.3 | 0.10 | YES |
| 0012 | 1000 | 34.4 | -12.2 | 129.3 | 0.10 | YES |

130 — Damage Data

| Location | | | System | Size |
|---|---|---|---|---|
| x | y | z | | |
| 33.9 (132) | -12.2 (134) | 129.3 (136) | Structure (138) | 0.10 (140) |

150 — Data Available for Analysis

DAMAGE DETECTION SYSTEM

BACKGROUND OF THE INVENTION

1. Field of the Invention

This invention is generally directed to damage detection and evaluation systems, and, more particularly to aircraft damage detection and evaluation systems that use a plurality of wireless transmitters.

2. Background Description

Identification of damaged locations in a system or on a vehicle is commonly dependent upon operator perception and analysis. Often, an operator is unable to adequately perceive the entire damaged location due to dynamic system movement or limited field of vision. For example, a machine operator may not be able to see a portion of the machine because it may be blocked by other parts of the machine or workers. Additionally, poor lighting may contribute to inadequate perception of the operator.

Quite often, the operator must rely on sensors for secondary systems or subsystems to obtain information relating to possible system damage. For example, a machine may have a sensor that reports hydraulic pressure available. When the available hydraulic pressure drops below a normal operating pressure, the operator may know that there is a malfunction or damage in the hydraulic system. Of course, sensors for other subsystems may include, but are not limited to, electrical systems, pneumatic systems, navigation systems, etc.

Systems that are particularly susceptible to this type of problem include vehicles, and specifically include aircraft. Often a pilot of an aircraft is confined to a cockpit area that has a limited field of view. The pilot must rely almost exclusively on instrument readings that are reported to the cockpit. However, the pilot may also perceive vibrations through the aircraft. Should an aircraft be involved in a collision, with a bird for example, the pilot may not be able to ascertain the full extent of damage to the aircraft until after landing. This is often too late.

Aircraft are generally designed with certain safety features that may isolate aircraft systems in the case of an emergency. However, the pilots often have no indication of potential system failure due to aircraft damage until system resources are depleted. For example, during combat, small arms fire may be a threat to the aircraft. If a bullet pierces the body of the aircraft and damages a hydraulic line thereby creating a small leak in the hydraulic system, the pilot may have no indication of the damage for several minutes or longer. During this time, the hydraulic system may be losing hydraulic fluid and the fluid may not be replaceable. Eventually, the hydraulic system may be depleted of fluid potentially causing even more serious problems. However, if the pilot were aware of the slow leak, the pilot may be able to isolate a portion of the hydraulic system that includes the leak, thus preserving the hydraulic fluid for the rest of the hydraulic system.

One well known incident involved a commercial aircraft crash at Sioux City Iowa. In this incident, an engine failure ruptured lines of all three hydraulic systems causing a total loss of hydraulic pressure to the aircraft. Had the pilots been aware of the damage to the hydraulic systems soon after the failure of the engine, they may have been able to isolate the damaged area before the total failure of the hydraulic system.

The present invention is directed to overcoming one or more of the problems or disadvantages associated with the prior art.

3. Discussion of Relevant Art

Systems have been developed which sense positions of certain components. For example, a method of sensing position for a workpiece and a tool that performs a manufacturing operation on the workpiece is disclosed in U.S. patent application Ser. No. 11/096,612, assigned to The Boeing Company, the entirety of which is hereby incorporated by reference. This method includes measuring at least three discrete point positions associated with a first component by using a transmitter having a known position and orientation and in a line of sight with the three distinct point positions. The three distinct point positions have known distances relative to one another. The method computes a current position and orientation of the first component using data provided by the transmitter and the three distinct point positions, along with position and orientation data from a last known location of the first component. The method assumes no sudden position changes for the first component. While this method tracks and senses position of certain components, the method does not detect or analyze damaged locations.

SUMMARY OF THE INVENTION

A damage detection system is described herein that includes a processor and at least one transmitter communicatively connected to the processor. The transmitter sends a signal to the processor and the processor may be programmed to assign a spatial coordinate to the transmitter. The processor may be further programmed to identify a transmitter location as damaged when the transmitter fails to send the signal.

A method of identifying a damaged location is also described herein. The method includes attaching a plurality of remotely powered transmitters to a vehicle, and each of the plurality of transmitters is adapted to send a signal to a processor. The method may further include providing remote power to the plurality of transmitters, thereby causing each of the plurality of transmitters to send the signal to the processor. The processor may then assign spatial coordinates to each of the plurality of transmitters and may monitor the plurality of transmitters to identify non-functioning transmitters. The processor may determine a damaged location by identifying an area of the vehicle based upon the spatial coordinates assigned to any non-functioning transmitter.

The features, functions, and advantages can be achieved independently in various embodiments of the present invention or may be combined in yet other embodiments.

BRIEF DESCRIPTION OF THE DRAWINGS

FIG. 4 is an example of tabulated data that may be compiled by the damage detection system of FIG. 3.

DETAILED DESCRIPTION

Damage detection systems may be employed on vehicles such as an aircraft. However, damage detection systems, such as the systems disclosed herein, can easily be adapted for use on any type of vehicle, for example, a car, a truck, a tank, a submarine, an airship, a space vehicle, a ship, or virtually any other type of vehicle. Such damage detection systems may be especially useful for combat aircraft.

Figure 1:
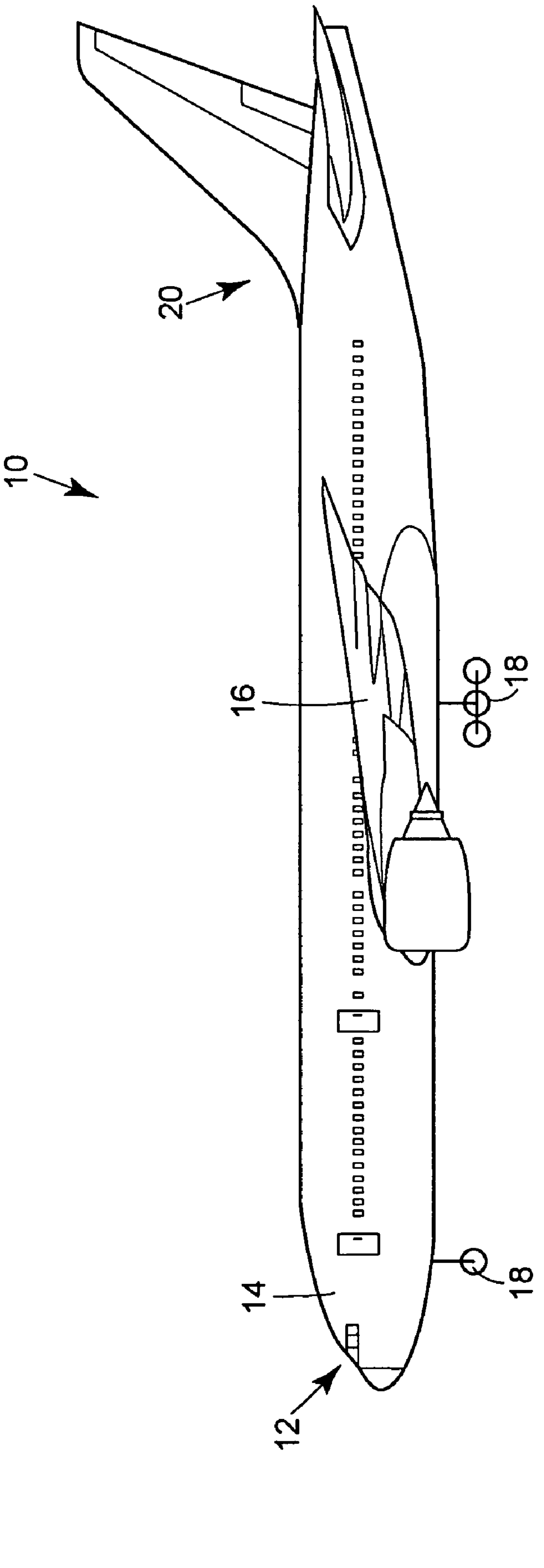
FIG. 1 is a side view of an exemplary aircraft.

As shown in FIG. 1, an aircraft 10 generally includes a cockpit or flight deck 12 from which one or more pilots controls the aircraft 10. Often, the pilot's view of the aircraft 10 is obscured by the body 14 of the aircraft 10. Accordingly, the pilot is unable to view large portions of the aircraft 10, for example, the underside of the wings 16, the landing gear 18, and/or the empennage 20. As a result, the pilots must rely on system instrumentation indications, such as hydraulic pressure, electrical volts and amperes, pneumatic pressures, etc., to alert the pilots to potential damage on the aircraft 10. The aircraft 10 in FIG. 1 is shown as an example of a vehicle that may use the damage detection system. Virtually any vehicle could use such a system, for example, automobiles, ships, submarines, helicopters, trucks, earth moving equipment, spacecraft, etc.

Figure 2:
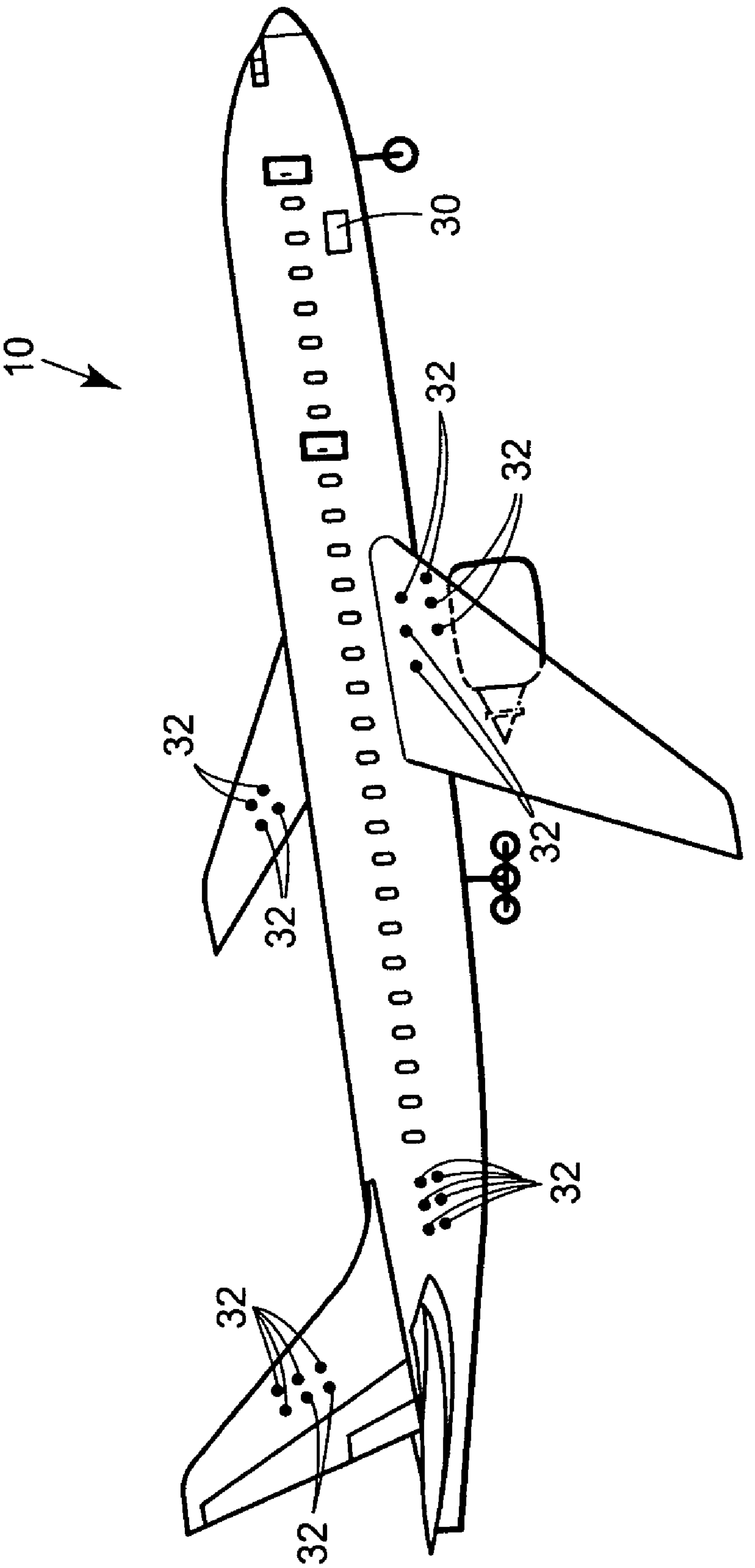
FIG. 2, is a top perspective view of the aircraft of FIG. 1 showing locations of a plurality of remote transmitters which comprise a damage detection system.

FIG. 2 shows the aircraft of FIG. 1 having a damage detection system. The damage detection system includes a processor 30 located in the aircraft 10 and a plurality of transmitters 32 arranged on the aircraft 10 at various locations. While FIG. 2 shows only certain locations having transmitters 32, the entire aircraft 10 could be substantially covered with such transmitters 32. Additionally, transmitters 32 may be located at certain critical locations within the body of the aircraft 10 itself to enhance early detection of damage to internal aircraft systems. The transmitters 32 may communicate with the processor 30 by sending a coded signal to the processor 30 continuously or periodically. The processor 30 may be programmed to decode the signal and determine the location of the transmitter 32 that sent the signal. The processor 30 may monitor all of the transmitters 32 and if a transmitter 32 fails to send the expected signal, the processor 30 may alert the pilot and identify the location of the transmitter 32 as a damaged location. The processor 30 may also determine if the transmitter 32 is simply malfunctioning, in which case, the processor 32 may simply remove the transmitter 32 from the system. As shown in FIG. 2, the damage detection system may allow the pilots to monitor the entire aircraft 10 without needing the ability to visually observe each part of the aircraft 10.

Figure 3:
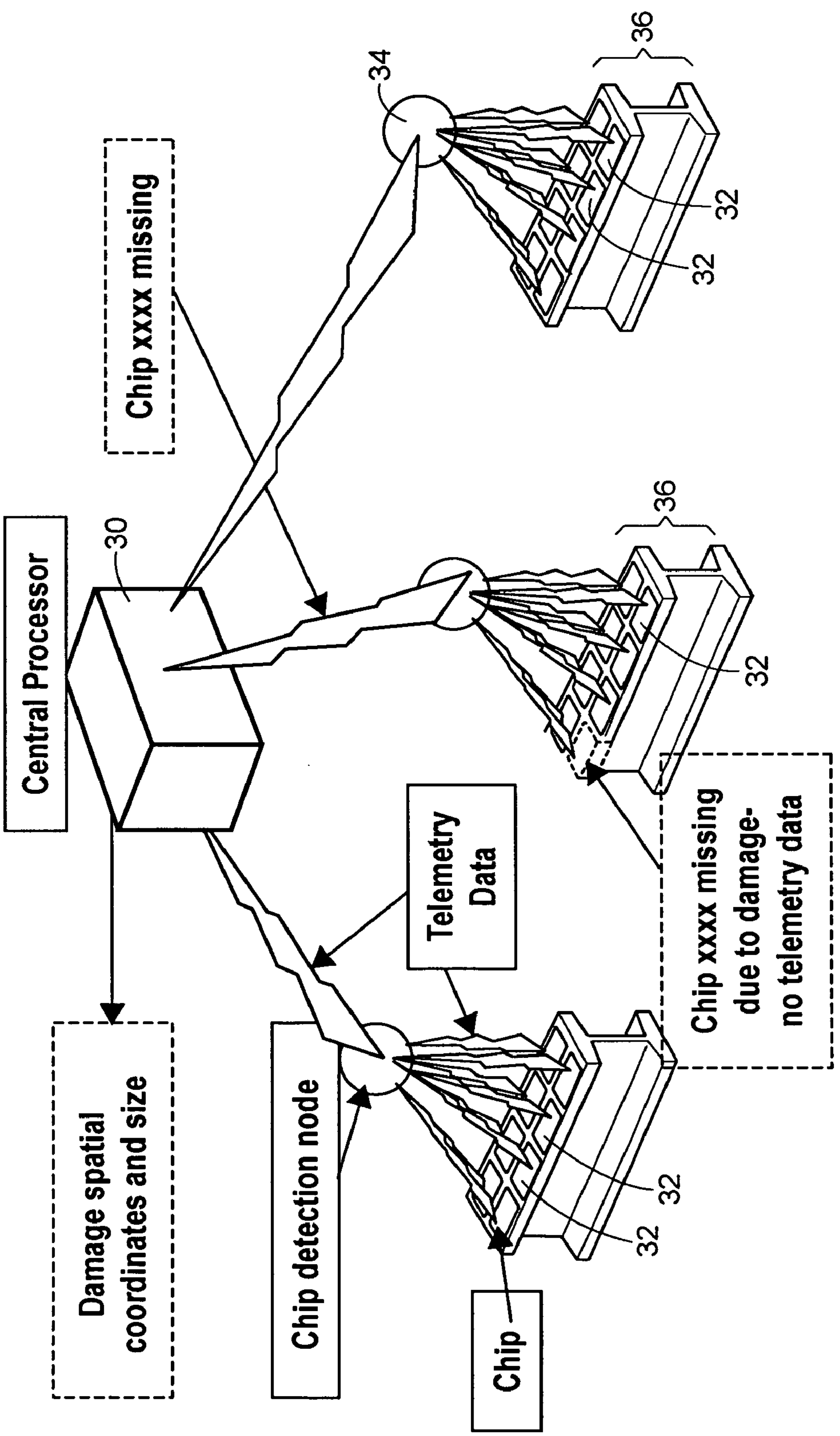
FIG. 3 is a schematic diagram of the damage detection system of FIG. 2.

FIG. 3 shows a schematic view of the damage detection system. Each of the transmitters 32 transmits a signal to the processor 30. In one embodiment, the transmitters 32 first transmit the signal to a node 34 which summarizes signal data from a group 36 of transmitters 32. The transmitters 32 may be assigned to certain groups 36 based on location or based on system type. For example, transmitters 32 placed on a wing structural component may be assigned to one group while transmitters 32 inside the wing on a hydraulic line may be assigned to another group. The nodes 34 may act as intermediaries between the transmitters 32 and the processor 30. This arrangement of nodes 34 may speed up transmission of the signals and may minimize processing time to analyze the signals.

The transmitters 32 preferably communicate with the processor 30 wirelessly. However, the transmitters 32 could be wired to the processor 30 if desired. Additionally, where nodes 34 are employed, the transmitters 32 preferably communicate wirelessly with the node 34 which in turn communicates wirelessly with the processor 30. However, in certain locations, it may be advantageous for the transmitters 32 to be wired to the node 34.

The transmitters 32 may either generate power internally, or rely on an excitement signal for power. For example, the transmitters 32 may be piezo-electric in nature and generate power from vibrations of the aircraft 10. In one embodiment, the piezo-electric transmitters may be chips that generate approximately 100 microcoulombs of electricity which may be stored temporarily in a capacitor. This amount of power is sufficient to generate and transmit the signal to the processor 30. Because an aircraft, or any vehicle, constantly generates vibrational energy, a virtually endless energy supply exists for the transmitters 32.

In another embodiment, the transmitters 32 may be radio frequency stimulated (e.g., RFID tags). The processor 30 may send out a radio frequency signal to the transmitters 32 which reflect back a signal to the processor 30. This arrangement is especially desirable for combat aircraft where the pilot may select a scanning time based on potential threats. For example, the pilot may only scan the aircraft 10 on egress after a mission to avoid potential detection by enemy anti-aircraft systems.

A wireless system is much lighter than a like wired system. Thus a wireless system is desirable over a wired system for an aircraft 10 because any reduction in empty weight of an aircraft 10 results in a corresponding increase in payload available. Furthermore, should one transmitter 32 fail, there is no doubt as to whether the transmitter 32 itself failed or the wiring between the transmitter and the processor has broken because there is no wire to break. Moreover, such wireless systems are very easily scaled and adaptable. For example, if an external fuel tank is added to an aircraft after an initial production, one or more transmitters 32 may simply be added to the external fuel tank and the programming of the processor 30 updated accordingly. Similar modifications could be made to the wireless system after repair or replacement of a component of after a rebuild of the wireless system.

Other means of powering the transmitters may exist, for example, solar power or wind power. The means of powering the transmitters 32 is not limiting so long as the transmitters 32 are able to transmit the signal to the processor 30. Additionally, while one embodiment of the damage detection system may use power scavenging chips as transmitters, the transmitters are not limited to a chip-like configuration and could vary widely in size and shape as long as the transmitters are able to send a signal to the processor.

FIG. 4 shows an example of data that may be generated by the processor 30 in response to signals sent from the transmitters 32. The data is only shown in table form for ease of reading and explanation. The processor 30 does not actually need to tabulate the data before analysis.

The table 100 includes several columns of information. The first column 110 shows an identification number assigned to the individual transmitter 32. The second column 112 shows a System ID, which corresponds to a particular aircraft system to which the transmitter 32 is assigned. For example, the System ID of "1000" shown in the figure may correspond to a structural member, such as a wing, tail, fuselage, etc. Other systems can be identified as well, for example, a System ID of "2000" may correspond to an engine, a System ID of "3000" may correspond to the hydraulic system, a System ID of "4000" may correspond to the electrical system, etc. Of course this labeling system allows for various sub-system identifiers as well. For example, a System ID of "2100" may correspond to the #1 engine, and a System ID of "2110" may correspond to the fuel control unit of the #1 engine. The System ID's may be kept very general or be made extremely specific based on user requirements, the complexity of the aircraft or vehicle and/or the number of transmitters employed in the system.

Columns 114-118 show the X, Y, and Z spatial coordinates assigned to the transmitter 32. These spatial coordinates may be assigned to the transmitter 32 at installation by exciting the system and recording the location of each transmitter 32 based on a reference location. Thereafter, the processor 30 is able to correlate a particular spatial coordinate to a particular location on the aircraft or vehicle. The Assigned Size column 120 shows how large an area is assigned to each transmitter 32. The assigned size may depend on the proximity of other transmitters 32. For example, transmitters 32 that are placed 1 inch apart may be assigned a size of one inch square. The Transmitting column 122 simply shows whether the particular transmitter 32 is sending the processor 30 a signal.

The Damage Data table 130 shows a summary of data for a non-functional transmitter 32. The non-functional transmitter's 32 spatial coordinates are shown in columns 132-136. The processor may be programmed to identify the area bounded by the spatial coordinates in columns 132-136 as the damaged area. The system column 138 shows that this particular transmitter 32 was assigned to a structure group meaning that the transmitter 32 was attached to a structure of the aircraft 10 as opposed to a sub-system. The information in column 138 corresponds to the System ID information of column 112 of table 100. The size column 140 shows that the area assigned to this particular transmitter is 0.1 inches square. The information from the Damage Data table 130 may be available to the processor 30 for further analysis.

The processor 30 may be programmed to analyze the data from the Damage Data table 130 for assessing structural integrity of the aircraft 10. After identifying the damage area, the processor may compare the damage area to structural information about the aircraft 10 and the processor 30 may determine whether the aircraft 10 remains airworthy based on the location and size of the damaged area. For example, should the size and location of the damage area indicate that a wing spar can no longer support its design load, the aircraft 10 should be subjected to only limited maneuvering until an appropriate repair is made. The processor 30 may further analyze the damage location to determine whether any sub-systems may be affected. For example, should the damage area be in the vicinity of a hydraulic line, the processor 30 may prompt the pilot to accomplish a particular checklist or to isolate the hydraulic system in the vicinity of the damage area if possible.

Should the damage detection system determine that a critical sub-system is located in the damage area, the processor 30 may immediately notify the pilot (or vehicle operator) through some sort of alert system, e.g., visual or aural alerts in the cockpit. The pilot may then take appropriate action based on the possible loss of the critical sub-system.

The processor 30 may be further programmed to infer potentially affected sub-systems or components based on two separate damage areas. For example, a projectile may enter a bottom portion of a wing and exit through a top portion of the wing. Should the damage detection system only have transmitters 32 disposed on the outer surfaces of the aircraft, the processor 30 may interpolate between the upper and lower damage locations to determine whether any sub-systems within the wing structure may have been damaged.

The damage detection system disclosed herein requires very little processing power due to the fact that only a limited amount of data is required for transmission. Each of the transmitters 32 may essentially send an identity code that can be a single number, and the processor 30 has stored the location and system data assigned to each particular transmitter 32. Data storage requirements for such a system are small as well. This limited amount of data also enables very fast processing times and simple programming for cross-referencing of each transmitter 32. As a result, damage detection systems described herein are relatively inexpensive and very light weight.

Additionally, the processor 30 may transmit the damage data to a ground station for further analysis. As a result, a maintenance technician may have access to the damage data and may recommend actions or procedures in addition to the actions and procedures recommended by the on-board damage detection system. Furthermore, the maintenance personnel may have additional time to prepare for potential repairs to the aircraft 10 before the aircraft 10 arrives at a maintenance station, thus saving valuable time and enabling a faster repair of the aircraft 10. This ability may prove critical in a war fighting situation.

Still further, based on the downloaded damage data, maintenance personnel may be able to determine an ideal repair facility to direct the aircraft 10 to should repair facilities with different capabilities be available. For example, if two repair facilities are available, but only one has a sheet metal shop, an aircraft with sheet metal damage should be directed to this particular repair facility if it is safe to do so.

Installations of such damage detection systems are simple as well. As transmitter sizes get smaller in response to technological advances, several application techniques may be available such as using light-duty adhesive bonding, for example. Furthermore, the transmitters 32 may be individually attached to the aircraft with an adhesive, or for smaller transmitter sizes, via brushing, spraying or spreading the transmitters over the selected surface. Moreover, the transmitters 32 may be integrated into the structures during fabrication of the structures. For example, the transmitters 32 may be mixed with or bonded into raw material prior to forming a particular structural element, such as a wing or a tail. For example, the transmitters 32 may be bonded between layers of a laminated structural element.

As a result, certain areas of the aircraft may be targeted for the transmitters 32. For example, only critical flight surfaces may be integrated in an effort to reduce cost and weight. Furthermore, a malfunctioning transmitter 32 may be "locked out" of the system. In other words, malfunctioning transmitters 32 may simply be ignored by the processor 30. Additionally, malfunctioning transmitters are easily replaced because the processor need only be updated to recognize the identity of each new transmitter 32. The spatial coordinates of the old transmitter 32 may then simply be assigned to the new transmitter 32.

Once the damage detection system has identified the damage area, this information may be sent to other aircraft systems for further analysis. For example, the damage area information may be sent to the fuel management system which may account for extra drag associated with the damage area. As a result, the navigation system may update the maximum range of the aircraft 10 and inform the pilot if the original destination is unreachable with the added drag.

Other aspects and features of the present invention can be obtained from a study of the drawings, the disclosure, and the appended claims.

What is claimed is:

1. A damage detection system for a vehicle comprising:

a processor; and at least one transmitter communicatively connected to the processor, wherein said at least one transmitter is adapted to be attached directly to a vehicle;

wherein the at least one transmitter sends a signal to the processor, the processor is programmed to assign a spatial coordinate to the at least one transmitter while attached directly to a vehicle and the processor is further programmed to identify a vehicle location of the at least one transmitter as damaged when the at least one transmitter fails to send the signal.

2. The system of claim 1, wherein the at least one transmitter is adapted to send a respective signal to the processor through a node.

3. The system of claim 1, wherein the processor is further programmed to determine a damaged area based upon the spatial coordinates of each damaged transmitter.

4. The system of claim 3, wherein the processor is further programmed to identify potentially affected systems that lie within the damaged area.

5. The system of claim 4, wherein the processor is further programmed to activate applicable checklists based on the other affected systems.

6. The system of claim 1, wherein the signal includes a unique transmitter identifier.

7. The system of claim 6, wherein the processor is further programmed to assign spatial coordinates to the unique transmitter identifier.

8. The system of claim 1, wherein the at least one transmitter is selected from the group consisting of a power scavenging chip, a radio frequency responsive chip, a solar powered chip and a wind powered chip.

9. The system of claim 8, wherein the at least one transmitter obtains power from vibration.

10. The system of claim 8, wherein the processor is further programmed to transmit a radio signal which activates the at least one transmitter.

11. The system of claim 10, wherein the processor transmits the radio signal upon one of a user initiation and a regular interval.

12. The system of claim 1, wherein the at least one transmitter is attached to a vehicle.

13. The system of claim 12, wherein the vehicle is an aircraft.

14. The system of claim 12, wherein the at least one transmitter is attached with one of an adhesive or paint.

15. The system of claim 12, wherein the at least one transmitter is integrated into a structural component of the vehicle.

16. The system of claim 1, wherein the at least one transmitter communicates wirelessly with the processor.

17. The system of claim 1, wherein the at least one transmitter may be manually removed from the system if the transmitter malfunctions.

18. The system of claim 17, wherein the at least one transmitter is either physically removed or removed from the programming in the processor.

19. A method of determining a damaged area of a vehicle comprising:

providing a processor;

attaching a plurality of remotely powered transmitters to a vehicle, each of the plurality of transmitters adapted to send a signal to the processor;

providing remote power to the plurality of transmitters, thereby causing each of the plurality of transmitters to send the signal to the processor;

assigning spatial coordinates to each transmitter in the plurality of transmitters;

monitoring the plurality of transmitters to identify non-functioning transmitters; and identifying a damaged area of the vehicle based upon the spatial coordinates assigned to any non-functioning transmitters.

20. The method of claim 19, wherein the vehicle is an aircraft.

21. The method of claim 19, wherein the plurality of transmitters comprises a plurality of power scavenging chips.

22. The method of claim 21, wherein each of the plurality of power scavenging chips converts structural vibrations into power.

23. The method of claim 22, wherein the power scavenging chips are piezo-electric chips.

24. The method of claim 21, wherein each of the plurality of transmitters comprises one of a solar powered chip, a wind powered chip and a piezo-electric chip.

25. The method of claim 19, wherein the plurality of transmitters comprises a plurality of radio frequency responsive chips, each of the plurality of radio frequency responsive chips converts radio frequency energy into power.

26. The method of claim 19, wherein the processor interpolates between non-functioning transmitters to determine the damaged area.

* * * * *